United States Patent [19]

Capasso et al.

[11] Patent Number: 5,727,010
[45] Date of Patent: Mar. 10, 1998

[54] ARTICLE COMPRISING AN IMPROVED QUANTUM CASCADE LASER

[75] Inventors: Federico Capasso, Westfield; Alfred Yi Cho, Summit; Jerome Faist, Scotch Plains; Albert Lee Hutchinson, Piscataway; Carlo Sirtori, Summit; Deborah Lee Sivco, Warren, all of N.J.

[73] Assignee: Lucent Technologies Inc., Murray Hill, N.J.

[21] Appl. No.: 618,886

[22] Filed: Mar. 20, 1996

[51] Int. Cl.$^6$ ............................. H01S 3/19; H01S 3/18
[52] U.S. Cl. ............................................. 372/45; 372/43
[58] Field of Search ........................... 372/45, 44, 43, 372/46

[56] References Cited

U.S. PATENT DOCUMENTS 5,457,709  10/1995  Capasso et al. ......................... 372/45

OTHER PUBLICATIONS

Faist et al, "Quantum Cascade Laser: An Intersub-band Semiconductor Laser Operating Above Liquid Nitrogen Temperature", Electronics Letters, vol. 30, No. 11, pp. 865–866, May 1994.

*Primary Examiner*—Rodney B. Bovernick
*Assistant Examiner*—Luong-Quyen T. Phan
*Attorney, Agent, or Firm*—Eugen E. Pacher

[57] ABSTRACT

The disclosed improved quantum cascade (QC) laser comprises features that facilitate lasing at temperatures above 260 K, preferably above 300 K. Among the features is a wavefunction-increasing feature that enhances the amplitude of the lasing level wavefunction in the adjacent upstream barrier layer, thereby increasing carrier injection efficiency into the lasing level. Exemplarily, the wavefunction-increasing feature is an approximately disposed thin quantum well. Among the features typically is also a chirped superlattice in the injection/relaxation region that acts as a Bragg reflector to suppress escape of carriers from the lasing level in the continuum, while facilitating carrier extraction from the ground state into a miniband, with the energy width of the miniband decreasing over at least a portion of the thickness of the injection/relaxation region.

8 Claims, 1 Drawing Sheet

ARTICLE COMPRISING AN IMPROVED QUANTUM CASCADE LASER

Field of the Invention

This invention pertains to the field of semiconductor lasers. More specifically, it pertains to unipolar semiconductor lasers.

BACKGROUND OF THE INVENTION

Recently, a new semiconductor laser was disclosed. See U.S. Pat. No. 5,457,709, incorporated herein by reference. The new laser was designated "Quantum Cascade" (QC) laser, and is based on one type of carrier (typically electrons) making transitions between energy levels created by quantum confinement.

QC lasers comprise a multiplicity (e.g., 25) of essentially identical undoped "active regions", each active region comprising a multiplicity of semiconductor layers. Between two adjacent active regions is disposed a multilayer semiconductor region, frequently referred-to as an "injection/relaxation" (I/R) region. At least some of the layers in each I/R region are doped.

The '709 patent discloses a QC laser that involves "diagonal" transitions, i.e., transitions between energy levels in adjacent quantum wells, with each I/R region being a digitally graded gap region. Exemplary QC lasers were reported to have lasing temperatures as high as 125 K.

Co-assigned U.S. Pat. No. 5,509,025, also incorporated herein by reference, discloses a QC laser with modified structure. Among the modifications was a change in the active regions such that the lasing transition was a "vertical" transition, i.e., a transition from a higher to a lower energy level in a given quantum well. A further modification was incorporated in the I/R regions, with the layer structure designed such that each I/R region provided (ungraded) "minibands" and a "minigap" between the minibands (see FIG. 11 of the '025 patent). Exemplary QC lasers according to the '025 patent were found to lase at, e.g., 100° K.

Co-assigned U.S. Pat. No. 5,502,787, also incorporated herein by reference, discloses a further modification, namely, provision of a highly doped layer in the upper cladding layer of a QC laser. The highly doped layer resulted in lowered refractive index of the upper cladding layer and in increased confinement of the fundamental laser mode. The I/R region comprised an "injector" consisting of 4 coupled quantum wells which form a pseudo-quaternary alloy simulating a graded gap (see Table II of the '787 patent). The '787 patent reported lasing at 130 K, but the QC laser did not lase at temperatures substantially above that temperature.

For obvious reasons it would be highly desirable to have available a QC laser capable of lasing at higher temperatures, (e.g., above about 260 K) preferably at room temperature (300 K). This application discloses such a QC laser.

SUMMARY OF THE INVENTION

In a broad aspect the invention is embodied in an article that comprises an improved QC laser.

In one embodiment, the QC laser comprises a multiplicity of essentially identical multilayer active regions, with a first and a second of said active regions being separated by a multilayer I/R region. The QC laser also comprises means for applying a voltage across the active regions with the I/R regions therebetween, such that charge carriers (typically electrons) flow (downstream) from the first active region towards the second active region. The first active region comprises one or more quantum wells (QWs), a first of said QWs has at least a second and a third energy state for the charge carriers, with the third energy state being higher than the second energy state. Associated with the second and third energy states are, respectively, second and third wavefunctions of charge carriers, said wavefunctions selected such that the charge carriers undergo a radiative transition from the third to the second energy state during operation of the QC laser.

Significantly, the first active region comprises a wavefunction-increasing feature for increasing (compared to an otherwise identical comparison laser not comprising said feature) an amplitude of the third wavefunction in a first barrier layer disposed between the first QW and an I/R region immediately upstream of the first active region. Exemplarily the wavefunction-increasing feature is an appropriately placed thin QW, but could also be, for instance, an appropriately placed layer of a semiconductor material of intermediate conduction band discontinuity.

In another embodiment the QC laser comprises the above discussed first and second active regions with a I/R region therebetween. The I/R region is selected to provide a miniband having an energy width, and is furthermore selected to provide a minigap above the miniband in energy. The minigap is selected to substantially prevent escape of charge carriers from the third energy state into the energy continuum, and the miniband is selected to facilitate removal of charge carriers from a non-lasing lower energy level. Significantly, the I/R region furthermore is selected such that the energy width of the miniband decreases over at least a portion of the distance from the first to the second active region, said portion including the contact between the I/R region and the second active region.

Currently preferred embodiments of the invention comprise the wavefunction-increasing feature as well as the above-described miniband of decreasing energy width. QC lasers according to the invention typically have a maximum lasing temperature above 260 K, preferably 300 K or more.

DETAILED DESCRIPTION OF A PREFERRED EMBODIMENT

Figure 1:
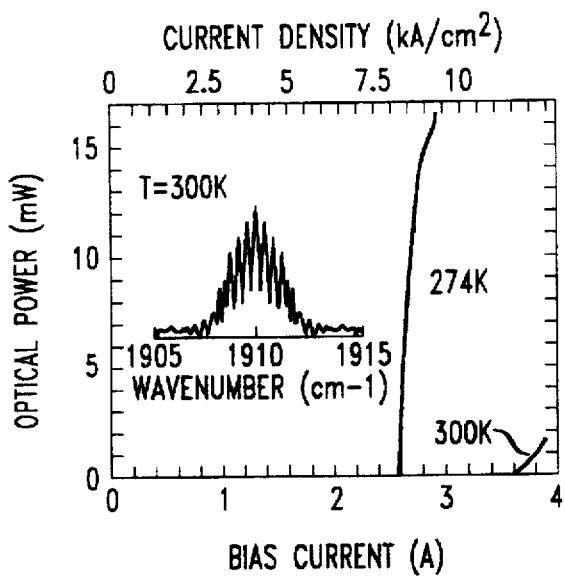
FIG. 1 shows exemplary data on bias current vs. optical power, as well as an exemplary spectrum of a QC laser at 300 K.

FIG. 1 shows data on optical power vs. bias current that demonstrates that a QC laser that can be caused to lase at 300 K has indeed been designed and made. The inset shows the output spectrum of the laser just above threshold at T=300 K. The data were obtained from a device that is 3.5 mm long and 10 μm wide. The device will now be described in detail.

Figure 2:
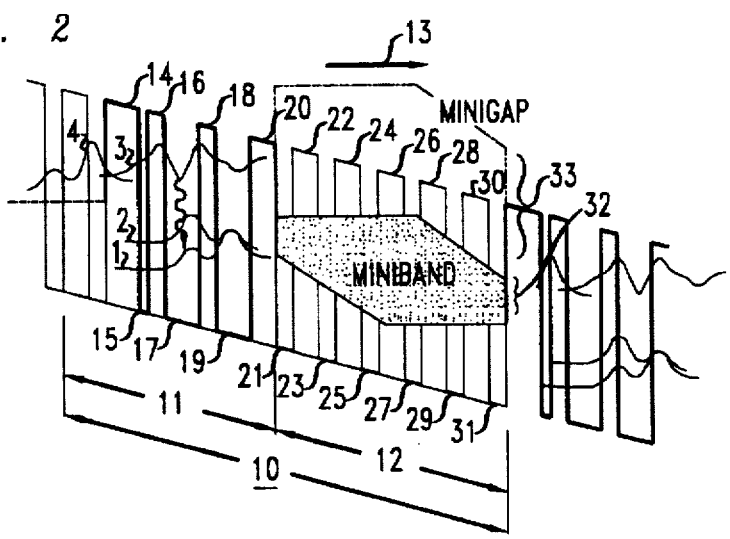
FIG. 2 schematically shows the conduction band diagram of a portion of the core region of an exemplary QC laser according to the invention.

The core region of the exemplary QC laser according to the invention comprises a multiplicity (e.g., 25) of essentially identical (i.e., exhibiting only unintentional variations) repeat units; each repeat unit consisting of an active region and an injection/relaxation (I/R) region. This is shown in FIG. 2, a schematic conduction band diagram of a portion of the core region, wherein numerals 10–12 designate, respectively, the repeat unit, the active region and the I/R region. Arrow 13 indicates the "down-stream" direction. It will be noticed that FIG. 2 pertains to a QC laser with electrons as charge carriers. Of course, a QC laser also could be designed to have holes as charge carriers. This, however, is not preferred. FIG. 2 corresponds to the conduction band under an applied field of 76 kV/cm, the threshold field of the structure.

All the barriers in the repeat unit of the exemplary QC laser have the same composition ($Al_{0.48}In_{0.52}As$), as have all the wells ($Ga_{0.47}In_{0.53}As$) thereof. A single repeat unit of the exemplary QC laser has the following layer thickness in nm, starting with barrier layer 14, and proceeding in the down-stream direction: 5.0, 0.9, 1.5, 4.7, 2.2, 4.0, 3.0. This completes the active region, layers 14–20, inclusive. The layer thicknesses in nm of the I/R region are 2.3, 2.3, 2.2, 2.2, 2.0, 2.0, 2.0, 2.3, 1.9, 2.8 and 1.9, extending from layer 21 to layer 31. All layers except layers 27–29 (inclusive) are undoped (not intentionally doped), and layers 27–29 are n-type, $2 \times 10^{17} cm^{-3}$ Si.

The design of the optical waveguide of the exemplary QC laser is similar to that of previously disclosed QC lasers. The lower cladding layer (300 nm InGaAs) is grown on a 35 nm graded gap layer which is disposed on the InP substrate. The top cladding layer, grown on top of a 30 nm thick interface-smoothing compositionally graded AlInGaAs layer, consists of three AlInAs regions of thickness 700, 600 and 1200 nm, respectively, with n-type doping concentrations of $2 \times 10^{17}$, $3 \times 10^{17}$ and $7 \times 10^{18} cm^{-3}$, respectively. A top 10 nm thick $n^{++}$ contact layer (Sn, $10^{20} cm^{-3}$) is separated from the recited upper cladding layer by a 30 nm $n^+$ AlInGaAs graded layer. Alternatively, the above referred to three AlInAs top cladding layers can be replaced by one or more InP layers (exemplarily two InP layers that differ in their doping level). The alternative structure will frequently have improved thermal properties.

Figure 3:
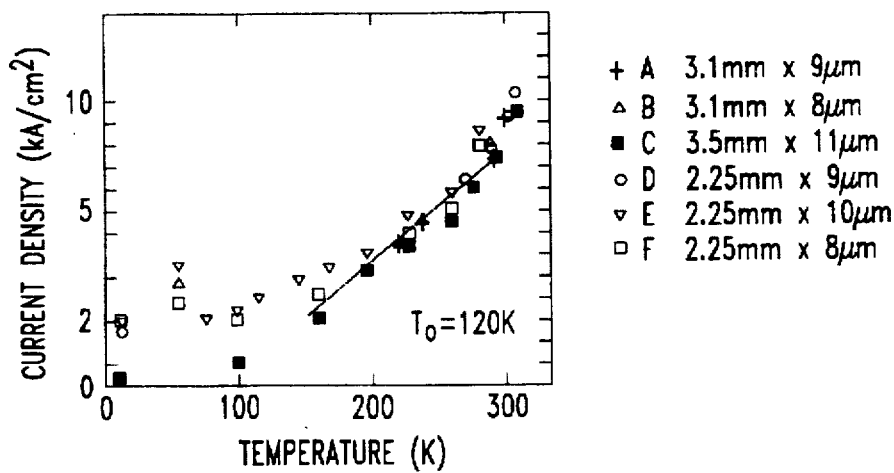
FIG. 3 shows data on bias current density vs. temperature for several exemplary QC lasers according to the invention.

Exemplarily, samples were processed into mesa etched ridge waveguides of width 10 μm by wet chemical etching and $SiO_2$ (350 nm) insulation. Non-alloyed Ti/Au ohmic contacts (0.4 μm thick) were provided to the top layer and the substrate. The lasers were then soldered, epilayer up, on Cu holders, wire bonded and mounted on a temperature-controlled cold head of a He flow cryostat. These devices were driven by 30 ns pulses with a 4–20 kHz repetition rate. FIG. 1 shows that the exemplary QC laser had a 1.5 mW laser output (λ~5 μm) at 300 K. In FIG. 3 the threshold current density $J_{th}$ is plotted as a function of temperature for four devices with various widths and lengths. All these devices have a maximum operating temperature larger than 274 K. Between ~160 K and 260 K, the data can be described by the usual exponential behavior J~exp (T/$T_0$), with an average $T_0$=120 K. As expected for intersubband lasers, this value advantageously is much larger than the one obtained for interband lead-salt or III–V antimonide lasers ($T_0$~20–60 K).

The exemplary QC laser has a ("vertical") lasing transition from the upper lasing level of quantum well 17 to the lower level thereof. Lifetime in the upper lasing level ($\tau_3$) is about 1.3 ps. The structure is designed such that at the threshold field (76 kV/cm) the ground states of quantum wells 17 and 19 have anticrossed to achieve an energy separation resonant with the optical phonon energy (~34 meV), resulting in a short (0.4 ps) lifetime ($\tau_2$) of the lower level of 17. Note that in FIG. 2 numerals 3, 2 and 1 refer to the wavefunctions associated with the upper and ground state energy levels of quantum well 17, and with the ground state energy level of quantum well 19, respectively. These energy levels are also referred-to as the n=3, n=2 and n=1 levels, respectively.

The exemplary QC laser of FIG. 2 exhibits strong overlap of wavefunctions 3 and 2, and comprises a novel wavefunction-increasing feature. This feature is quantum well 15, which exemplarily is 0.9 nm thick and selectively enhances the amplitude of wavefunction 3 in barrier layer 14. This increases the electron injection efficiency into the n=3 state by increasing the overlap between wavefunction 3 and the ground state wavefunction 4 of the upstream I/R region, while reducing the overlap between wavefunction 4 and wavefunctions 1 and 2. The latter minimizes electron injection into the n=1 and n=2 states by elastic or inelastic scattering. It can also be noted that the provision of the 0.9 nm thick well 15 does not noticeably reduce the oscillator strength ($z_{32}$) of the lasing transition. Numerical calculation shows that $z_{32}$=1.6 nm in the exemplary QC laser.

A further novel performance-enhancing feature is provided in the I/R region. The chirped superlattice of the I/R region acts as a Bragg reflector to suppress the escape of electrons from the n=3 excited state into the continuum while facilitating their extraction from the n=1 state into miniband 32. The superlattice of the I/R region 12 is designed (through appropriate choice of well and barrier thicknesses) such that the width (in energy) of miniband 32 decreases towards the adjacent downstream active region over at least a portion of I/R region 12, generally a portion that extends to the adjacent downstream active region. The decreasing width minimizes injection into the downstream active region of electrons that are thermally excited into higher states of the miniband, thereby funneling electrons into ground state 4 of the I/R region.

To minimize degradation of lasing threshold and slope efficiency at high temperature, it is advantageous to minimize the number of electrons that are thermally activated from the relaxation region into level 2 of the upstream active region. This can be achieved by designing the layer structure such that the energy difference (Δ) between the quasi-Fermi energy in the graded gap region and the n=2 state is relatively large and the sheet density of the n-type doped injection region is kept relatively low. In the exemplary QC laser according to the invention, the former is about 110 meV and the latter is about $1.2 \times 10^{11} cm^{-2}$.

Those skilled in the art will know that computer simulation programs that facilitate accurate modeling of semiconductor structures such as the multilayer structure of QC lasers are readily available. FIG. 2 herein, including the wavefunctions, is based on such modeling.

The invention claimed is:

1. An article comprising a quantum cascade laser, said laser to be referred to as the "QC" laser, the QC laser comprising a) a multiplicity of essentially identical multilayer active regions, a first of said active regions being separated from an adjacent second of said active regions by a multilayer injection/relaxation region, said injection/relaxation region to be referred to as the "I/R" region; and b) means for applying a voltage across the first and second active regions with the I/R region therebetween, such that charge carriers of a given conductivity type flow from the first active region towards the second active region, said flow being in a downstream direction opposite to an upstream direction; wherein c) said first active region comprises one or more quantum wells, a first of said quantum wells having at least a second and a third energy state for charge carriers of the given conductivity type, with said third energy state being higher than the second energy state; wherein d) associated with said second and third energy states are, respectively, second and third wavefunctions for the charge carriers of the given conductivity type, with said second and third wavefunctions selected such that charge carriers of the given conductivity type undergo a radiative transition from the third to the second energy state during operation of the QC laser;

CHARACTERIZED IN THAT e) at least said first active region comprises a wavefunction-increasing feature for increasing, compared to an otherwise identical comparison laser that does not comprise the wavefunction-increasing feature and has a maximum lasing temperature, an amplitude of said third wavefunction in a first barrier layer disposed between said first quantum well and an I/R region immediately upstream of the first active region; such that said QC laser has a maximum lasing temperature higher than the maximum lasing temperature of said comparison laser.

2. Article according to claim 1, wherein the I/R region between the first and second active regions is selected to provide a miniband having an energy width, and furthermore is selected to provide a minigap above said miniband in energy; wherein i) said minigap is selected to substantially prevent escape of charge carriers of the given conductivity type from the third energy state of the first active region into an energy continuum;

ii) said miniband is selected to facilitate removal of charge carriers of the given conductivity type from the second energy state of the first active region;

iii) said energy width decreases over at least a portion of the distance from said first active region to said second active region, said portion including the interface between the I/R region and the second active region; and iv) said wavefunction-increasing feature and said I/R region are selected such that the QC laser has a maximum lasing temperature above 260 K.

3. Article according to claim 2, wherein all active regions are essentially identical, and all I/R regions are essentially identical, and the charge carriers of the given conductivity type are electrons.

4. Article according to claim 3, wherein said active regions and said I/R regions are selected such that the QC laser has a maximum lasing temperature of at least 300 K.

5. Article according to claim 2, said QC laser further comprising an upper cladding region and a lower cladding region, with said active regions disposed between the upper and lower cladding regions, wherein at least said upper cladding region comprises at least one InP layer.

6. Article according to claim 1, wherein said wavefunction-increasing feature is a quantum well disposed in the first active region upstream of the first quantum well.

7. Article according to claim 1, said QC laser further comprising an upper cladding region and a lower cladding region, with said active regions disposed between the upper and lower cladding regions, wherein at least said upper cladding region comprises at least one InP layer.

8. An article comprising a quantum cascade laser, said laser to be referred to as the "QC" laser, the QC laser comprising a) a multiplicity of essentially identical multilayer active regions, a first of said active regions being separated from an adjacent second of said active regions by a multilayer injection/relaxation region, said injection/relaxation region to be referred to as the "I/R" region; and b) means for applying a voltage across the first and second active regions with the I/R region therebetween, such that charge carriers of a given conductivity type flow from the first active region towards the second active region; wherein c) said I/R region is selected to provide a miniband having an energy width and furthermore is selected to provide a minigap above said miniband in energy; wherein d) said minigap is selected to substantially prevent escape of charge carriers of the given conductivity type from an upper lasing energy level of the first active region into an energy continuum; and e) said miniband is selected to facilitate removal of charge carriers of the given conductivity type from a non-lasing lower energy level of the first active region;

CHARACTERIZED IN THAT f) said I/R region furthermore is selected such that the energy width of said miniband decreases over at least a portion of the distance from said first active region to said second active region, said portion including the contact between the I/R region and the second active region.

* * * * *